(12) United States Patent
Luo et al.

(10) Patent No.: US 7,598,523 B2
(45) Date of Patent: Oct. 6, 2009

(54) TEST STRUCTURES FOR STACKING DIES HAVING THROUGH-SILICON VIAS

(75) Inventors: Wen-Liang Luo, Toufen Town (TW); Yung-Liang Kuo, Hsin-Chu (TW); Hsu Ming Cheng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 388 days.

(21) Appl. No.: 11/725,403

(22) Filed: Mar. 19, 2007

(65) Prior Publication Data
US 2008/0272372 A1 Nov. 6, 2008

(51) Int. Cl.
*H01L 29/10* (2006.01)

(52) U.S. Cl. ............... 257/48; 257/E23.011; 257/686

(58) Field of Classification Search ............ 257/686, 257/723, 724, E23.011
See application file for complete search history.

(56) References Cited

U.S. PATENT DOCUMENTS 7,439,615 B2 * 10/2008 Ruckerbauer ............ 257/700

2002/0036338 A1 * 3/2002 Matsuo et al. ............ 257/686
2008/0073747 A1 * 3/2008 Chao et al. ............... 257/520

\* cited by examiner

*Primary Examiner*—Evan Pert
*Assistant Examiner*—Krista Soderholm
(74) *Attorney, Agent, or Firm*—Slater & Matsil, L.L.P.

(57) ABSTRACT

A semiconductor die including a test structure is provided. The semiconductor die includes a loop-back formed on a surface of the semiconductor die. The loop-back structure includes a first bonding pad on a first surface; and a second bonding pad on the first surface, wherein the first and the second bonding pads are electrically disconnected from integrated circuit devices in the semiconductor die. A conductive feature electrically shorts the first and the second bonding pads. An additional die including an interconnect structure is bonded onto the semiconductor die. The interconnect structure includes a third and a fourth bonding pad bonded to the first and the second bonding pads, respectively. Through-wafer vias in the additional die are further connected to the third and fourth bonding pads.

19 Claims, 9 Drawing Sheets

TEST STRUCTURES FOR STACKING DIES HAVING THROUGH-SILICON VIAS

TECHNICAL FIELD

This invention relates generally to integrated circuits, and more particular to manufacturing and packaging techniques for stacking semiconductor dies having through-silicon vias.

BACKGROUND

Since the invention of integrated circuits, the semiconductor industry has experienced a continuous rapid growth due to constant improvements in the integration density of various electronic components (i.e., transistors, diodes, resistors, capacitors, etc.). For the most part, this improvement in integration density has come from repeated reductions in minimum feature size, which allows for more components to be integrated into a given chip area.

These integration improvements are essentially two-dimensional (2D) in nature, in that the volume occupied by the integrated components is essentially on the surface of the semiconductor wafer. Although dramatic improvement in lithography has resulted in considerable improvements in 2D integrated circuit formation, there are physical limitations to the density that can be achieved in two dimensions. One of these limitations is the minimum size needed to make these components. Also, when more devices are put into one chip, more complex designs are required.

Three-dimensional integrated circuits (3D IC) are therefore created to resolve the above-discussed limitations. Higher device density has been achieved using 3D IC technology, and allowing the bonding of up to six layers of wafers. As a result, the total wire length is significantly reduced. The number of vias is also reduced. Accordingly, 3D IC technology has the potential of being the mainstream technology of the next-generation integrated circuit.

Conventional methods for forming 3D IC also include die-to-wafer bonding, wherein a plurality of individual dies is bonded to a same wafer. An advantageous feature of the die-to-wafer bonding is that the size of the dies may be smaller than the size of the chips on the wafer. Through-silicon vias, also referred to as through-wafer vias, are used to connect the integrated circuits in the dies and the integrated circuits in the wafer. FIG. 1 illustrates a conventional 3D IC including through-silicon vias. Dies 4 and 6 are stacked on bottom wafer 2, wherein each of the dies 4, 6 and bottom wafer 2 includes integrated circuits. Through-silicon vias 8 are formed in dies 4 to connect the underlying wafer 2 to the overlying dies 6.

After dies 4 and 6 are bonded onto wafer 2, a wafer probing is performed to the stacked dies. Only those stacked dies that pass the probe tests are packaged. By identifying problematic stacked dies at an early stage, packaging costs are saved. Typically, the test programs for probing the stacked dies are generated by merging individual test programs for testing dies 4 and 6, and dies on wafer 2. However, since dies 4 and 6 and wafer 2 are separately manufactured, their test programs may be generated for different platforms. For example, some of the test programs are UNIX-based, and some are Window-based. Merging these test programs thus becomes a very challenging task.

Accordingly, what is needed in the art are test methods and/or test structures for probing stacked dies without incurring difficulties in merging the test programs.

SUMMARY OF THE INVENTION

In accordance with one aspect of the present invention, a semiconductor die includes a loop-back formed on a surface of the semiconductor die. The loop-back structure includes a first bonding pad on the surface; and a second bonding pad on the first surface, wherein the first and the second bonding pads are electrically disconnected from integrated circuit devices in the semiconductor die. A conductive feature electrically shorts the first and the second bonding pads.

In accordance with another aspect of the present invention, a semiconductor package structure includes a second die bonded onto a first die. The first die includes a loop-back structure, which further includes a first bonding pad on a first surface of the first die; a second bonding pad on the first surface of the first die; and a conductive feature electrically shorting the first and the second bonding pads. The second die includes an interconnect structure, which further includes a third bonding pad and a fourth bonding pad on a first surface of the second die, wherein the third and the fourth bonding pads are bonded to the first and the second bonding pads of the first die, respectively; a first and a second through-silicon via; and a fifth and a sixth bonding pad on a second surface opposite the first surface of the second die. The third and the fifth bonding pads are electrically shorted through the first through-silicon via. The fourth and the sixth bonding pads are electrically shorted through the second through-silicon via.

In accordance with yet another aspect of the present invention, a semiconductor package structure includes a first die; a second die bonded onto the first die; and a plurality of test structures formed throughout the first and the second dies. Each of the plurality of test structures includes a loop-back structure in the first die. The loop-back structure includes a first bonding pad on a first surface of the first die; a second bonding pad on the first surface of the first die; and a conductive feature electrically shorting the first and the second bonding pads. Each of the plurality of test structures further includes a third bonding pad and a fourth bonding pad on a first surface of the second die, wherein the third and the fourth bonding pads are bonded to the first and the second bonding pads of the first die, respectively; a first and a second through-silicon via in the second die; and a fifth and a sixth bonding pad on a second surface opposite the first surface of the second die. The third and the fifth bonding pads are electrically connected through the first through-silicon via. The fourth and the sixth bonding pads are electrically shorted through the second through-silicon via.

In accordance with yet another aspect of the present invention, a method of forming a semiconductor package structure includes forming a conductive feature in a first die; forming a first bonding pad on a first surface of the first die, wherein the first bonding pad is electrically connected to the conductive feature; and forming a second bonding pad on the first surface of the first die. The first and the second bonding pads are electrically disconnected from integrated circuit devices in the semiconductor die.

In accordance with yet another aspect of the present invention, a method of forming a semiconductor package structure includes forming a plurality of loop-back structures in a first die, and forming a plurality of interconnect structures in a second die. Each of the plurality of loop-back structures includes a first bonding pad on a first surface of the first die; a second bonding pad on the first surface of the first die; and a conductive feature electrically shorting the first bonding pad and the second bonding pad. Each of the plurality of the interconnect structures includes a third bonding pad and a fourth bonding pad on a first surface of the second die; a first through-silicon via and a second through-silicon via in the second die; and a fifth bonding pad and a sixth bonding pad on a second surface of the second die opposite the first surface of the second die. The third and the fifth bonding pads are electrically shorted through the first through-silicon via. The fourth and the sixth bonding pads are electrically shorted through the second through-silicon via. The method further includes bonding the second die onto the first die, with the third bonding pad and the fourth bonding pad in each of the interconnect structures bonded to the first and the second bonding pads in a respective one of the plurality of loop-back structures. Each of the loop-back structures forms a test structure with the respective interconnect structure.

The advantageous features of the embodiments of the present invention include reducing complexity in the probing process of the stacked dies and increasing the ability to detect the direction and the magnitude of misalignments.

BRIEF DESCRIPTION OF the DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Typically, before bonding dies and/or wafers, dies on wafers are probed and sorted. Dies designated to be bonded with wafers are also probed and sorted. Only dies passing the probing process are bonded onto the wafers. If some dies on wafers do not pass the probing process, dummy dies will be bonded on the problematic dies on wafers. Therefore, the dies that are bonded and probed (except dummy dies) after stacking are known-good-dies. It can thus be reasonably expected that the stacked dies will function correctly if the stacking process is performed without any misalignment occurring. Based on this analysis, the probing process can be simplified.

Figure 1:
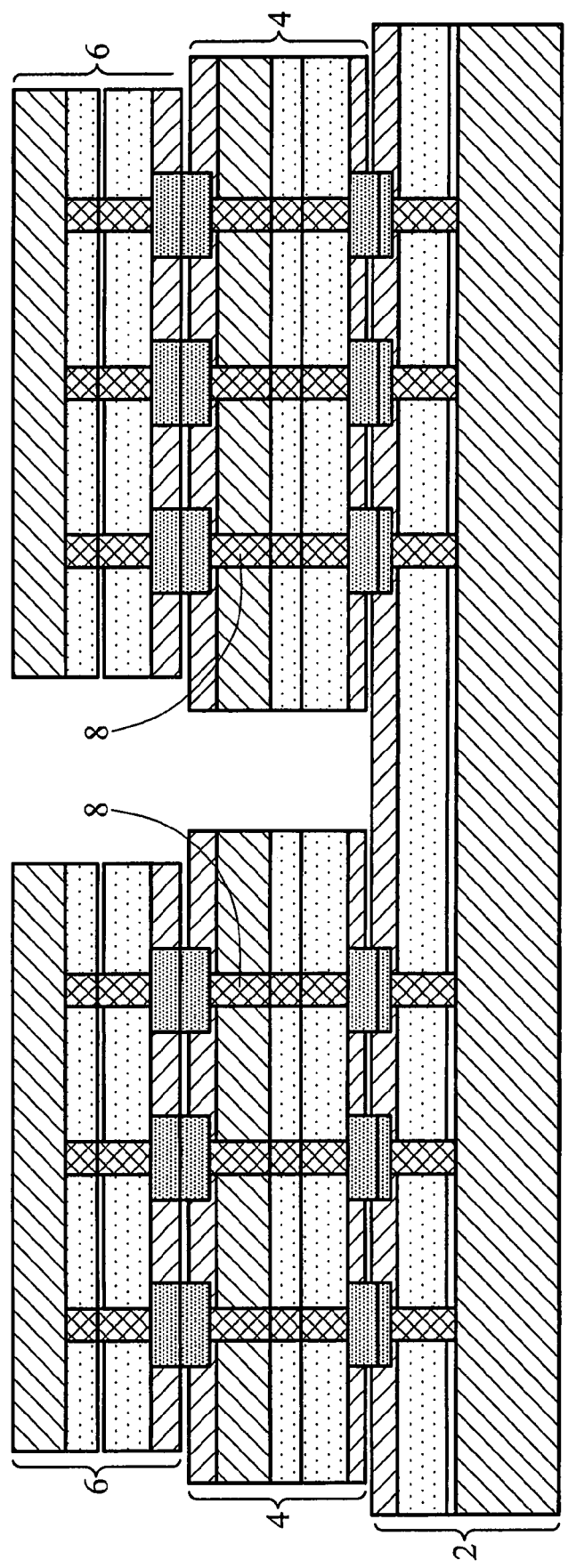
FIG. 1 illustrates a conventional package structure including stacked dies.
Figure 2A:
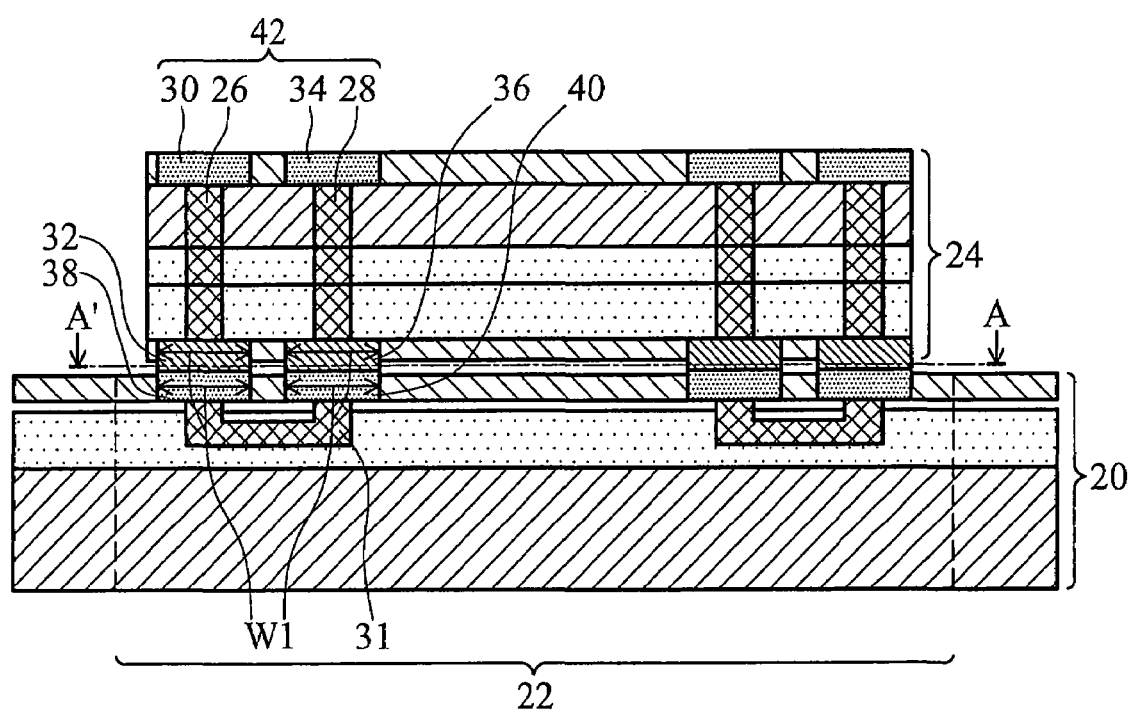
FIGS. 2A and 2B are a cross-sectional view and a top view of an embodiment of the present invention, respectively.

FIG. 2A illustrates a cross-sectional view of an embodiment of the present invention, wherein test structure 42 is formed throughout the stacked dies. A known-good-die 24 is bonded onto die 22, which is one of the known-good-dies in wafer 20. Wafer 20 further includes more dies, which are not illustrated for purposes of simplicity. A pair of through-silicon vias (TSV) 26 and 28 is formed in die 24. TSV 26 is electrically connected (shorted) to bonding pad 30, which is on a first side of the die 24, and bonding pad 32 on a second side of die 24, wherein the second side is located opposite the first side. Similarly, TSV 28 is electrically connected (shorted) to bonding pad 34 on the first side of die 24, and bonding pad 36 on the second side of die 24. TSVs 26, 28, and the respective connecting bonding pads 30, 32 and 34 and 36 form an interconnect structure.

Die 22 includes a loop-back structure including bonding pads 38 and 40 on top surface of die 22, and a shorting structure 31 electrically shorting bonding pads 38 and 40. The shorting structure 31 preferably includes vias and metal lines formed in the metallization layers of die 22. In the preferred embodiment, the shorting structure 31 includes an aluminum line formed in the top metallization layer, and two vias each connecting one of the bonding pads 38 and 40 to the aluminum line. In alternative embodiments, shorting structure 31 may include vias and metal lines in metallization layers lower than the top metallization layer. Shorting structure 31 may even extend to the substrate of die 22. In an embodiment, bonding pads 32 and 38 are substantially aligned, and bonding pads 36 and 40 are substantially aligned. After bonding die 24 onto die 22, bonding pads 32 and 38 are preferably physically contacted, and bonding pads 36 and 40 are preferably physically contacted.

The interconnect structure in die 24 and the loop-back structure in die 22 form test structure 42. After the bonding process, the loop-back structure in die 22 electrically connects (shorts) bonding pads 30 and 34, in which an electrical connection can be detected. If a misalignment occurs, and at least one of the bonding pads 32 and 36 is not bonded with the respective bonding pads 38 and 40, bonding pads 30 and 34 will be electrically disconnected. Accordingly, it is expected that other bonds (not shown) between dies 22 and 24, which are for interconnecting integrated circuits in dies 22 and 24, are also misaligned. The corresponding stacked die should then be discarded. In the embodiment illustrated in FIG. 2A, the electrical disconnection occurs if the misalignment exceeds W1, which is the width (or length) of bonding pads 32, 38, 36 and 40. If bonding pads 30 and 34 are electrically connected, the corresponding stacked dies may be packaged.

Figure 2B:
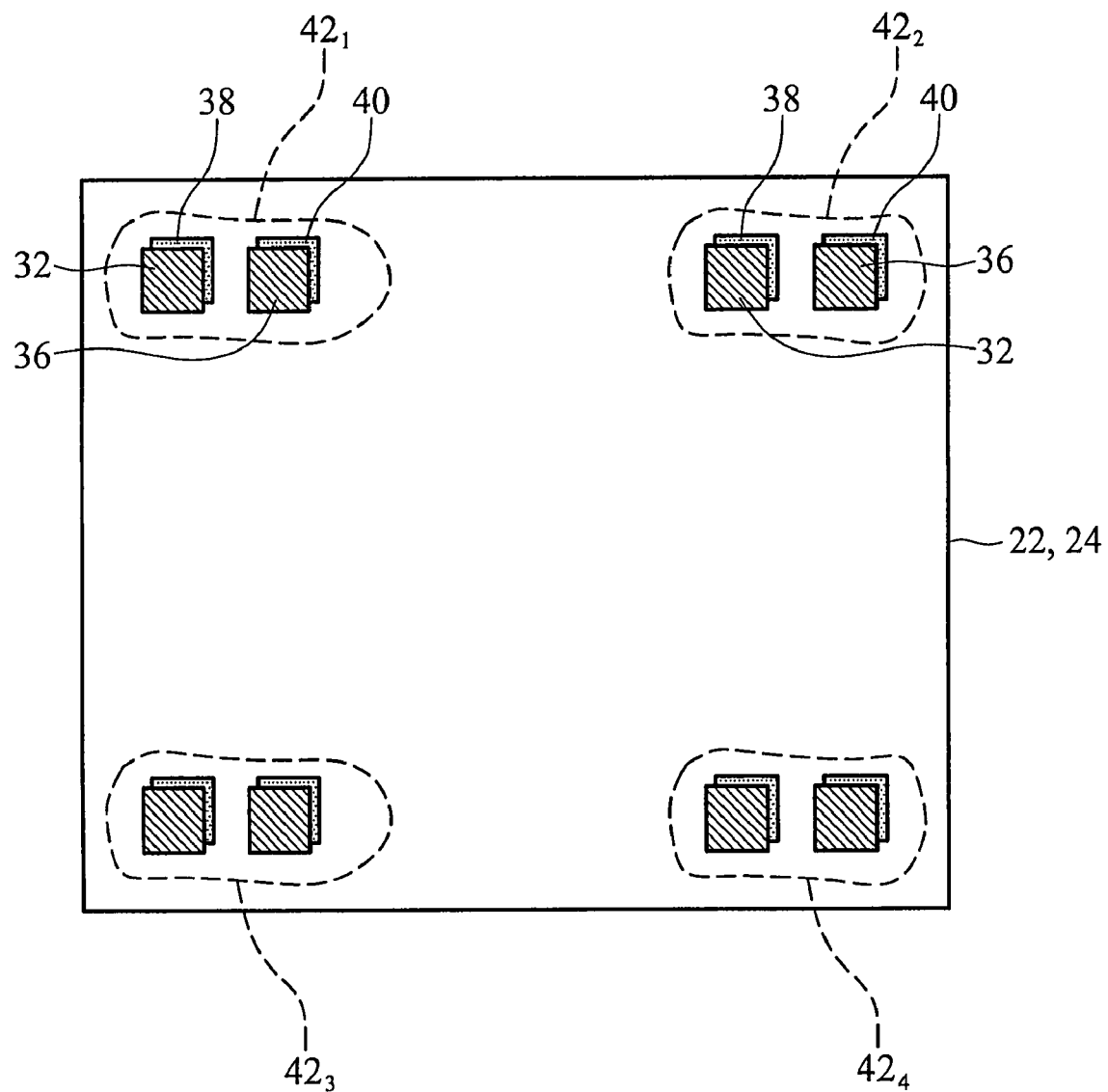

For each of the stacked dies, a plurality of the test structures as shown in FIG. 2A can be formed. FIG. 2B illustrates a top view of the embodiment shown in FIG. 2A, wherein the top view is taken in a plane crossing line A-A'. In the preferred embodiment, test structures 42, which are denoted as $42_1$, $42_2$, $42_3$ and $42_4$, are formed, each at a corner of the stacked dies. Please note that bonding pads 32 and 36 are illustrated as slightly offset from the respective bonding pads 38 and 40 for a clearer view, although they may be substantially overlapped. An advantageous feature for forming test structures at the corners of the stacked dies is that if misalignment is due to the rotation of die 24 relative to die 22, the magnitude of the misalignment may be more significant at corner regions. Additionally, corner regions may have more unused spaces for accommodating the test structures. In alternative embodiments, test structures 42 may be formed at other locations of the stacked dies than at the corners.

Figure 3:
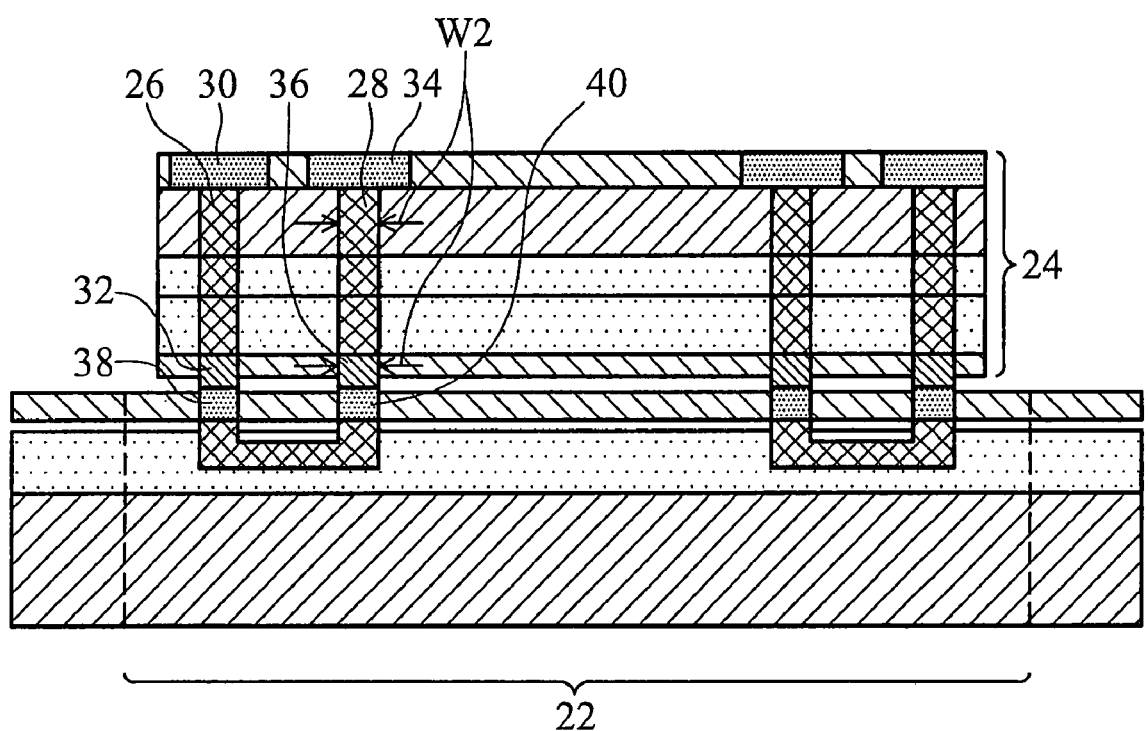
FIG. 3 is a cross-sectional view showing a test structure with bonding pads and through-silicon vias having substantially equal sizes.

Typically, bonding pads have greater sizes than the connecting TSVs. However, in an embodiment of the present invention, the test structures may include bonding pads and TSVs that have substantially similar sizes. FIG. 3 illustrates a cross-sectional view of an embodiment, wherein bonding pads 32 and 36 have a substantially same width W2 (and a same length) as bonding pads 38 and 40. In this case, bonding pads 30 and 34 are electrically disconnected if the misalignment exceeds dimension W2. Advantageously, this provides for a higher accuracy of detecting the misalignment.

Figure 4:
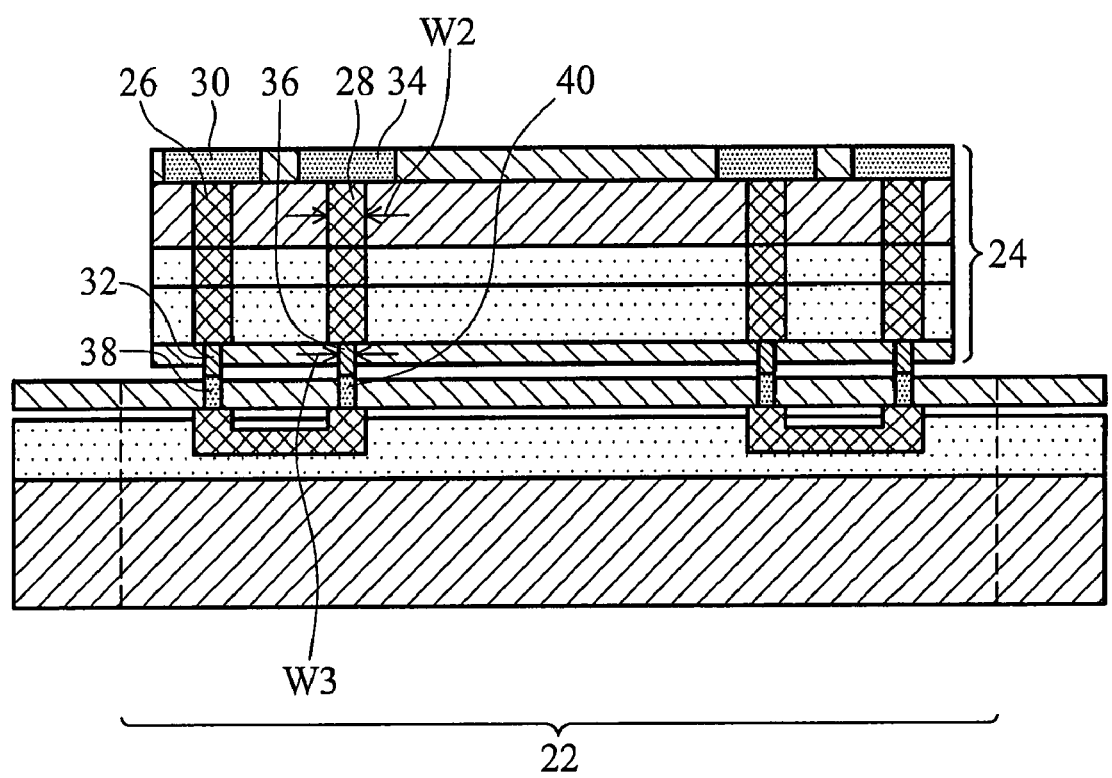
FIG. 4 is a cross-sectional view showing a test structure with bonding pads having smaller sizes than through-silicon vias.

In FIG. 4, bonding pads 32 and 36 have width W3 less than width W2 of TSVs 26 and 28, and thus misalignment detection has greater level of accuracy.

Figure 5:
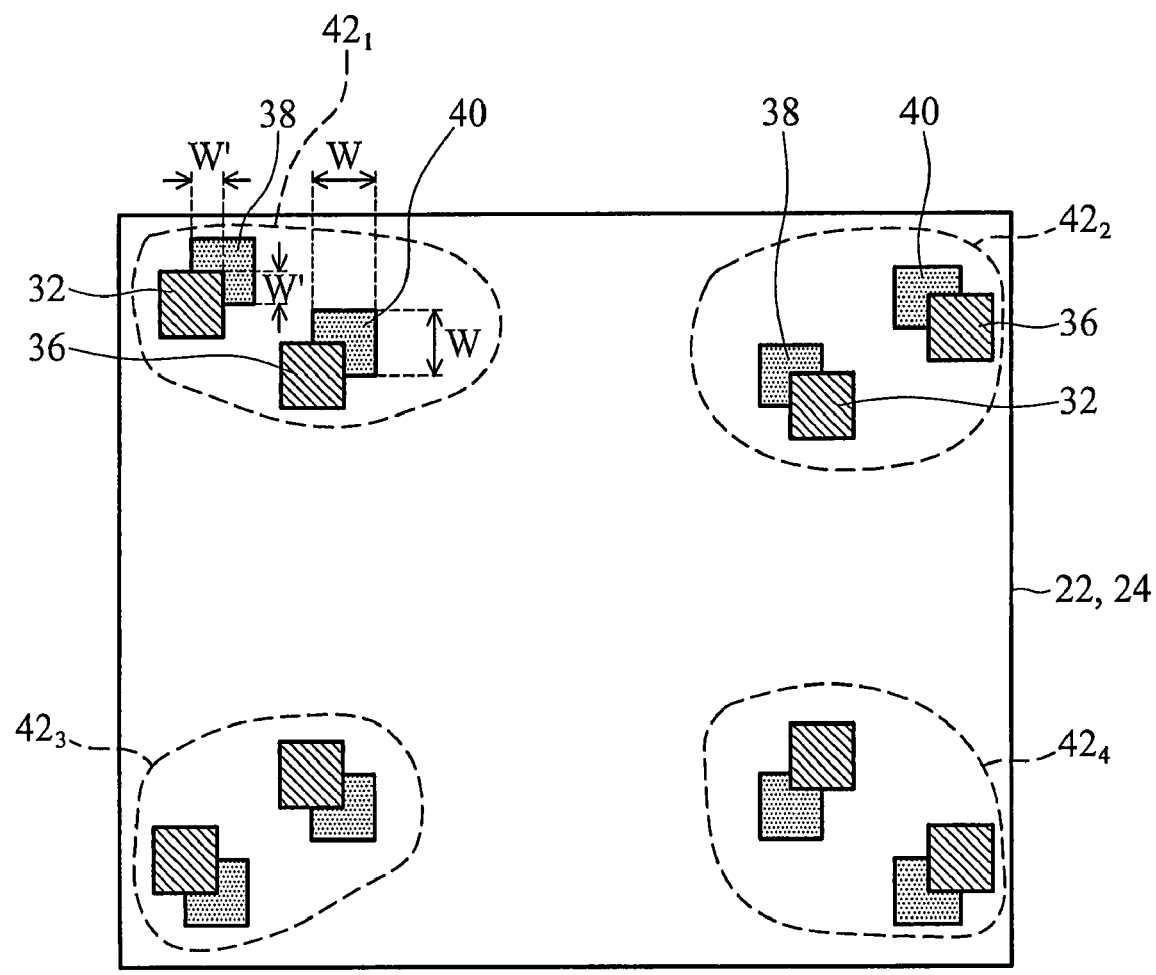
FIGS. 5 and 6 illustrate top views of embodiments of the present invention, wherein bonding pads of the test structures are misaligned.

In the above-discussed embodiments, the magnitude of the misalignment can be found. It is also desirable to be able to determine the direction of the misalignment, so that the subsequent bonding processes may be improved. FIG. 5 illustrates a top view of an embodiment, wherein the top view is taken at the interface between dies 24 and 22 (refer to FIG. 2A). This embodiment includes a plurality of test structures 42 having partially overlapped bonding pads. At the top left corner of the stacked dies, test structure $42_1$ includes bonding pads 32 and 36 shifted toward the bottom left direction from the respective bonding pads 38 and 40. Bonding pads 32 and 36 belong to top die 24, while bonding pads 38 and 40 belong to bottom die 22. Assuming bonding pads 32, 36, 38 and 40 have dimensions W, and the overlap regions, which are between bonding pads 32 and 36 and the respective bonding pads 38 and 40, have dimensions W', it is noted that if the top die 24 misaligns toward the lower direction and/or the left direction (as illustrated) for a magnitude greater than W', the electrical connection of test structure $42_1$ is broken. If, however, top die 24 misaligns toward the upper direction and/or the right direction, the electrical connection of test structure $42_1$ is broken only if the magnitude of the misalignment exceeds 2W-W'. Therefore, the test structure at the upper left corner is more sensitive to the misalignment with top die 24 shifting toward the lower and/or left direction. Similarly, the remaining test structures at other corners have partially overlapped bonding pads, except that bonding pads 32 and 36 of the test structure $42_2$ is shifted to the lower right direction from the respective bonding pads 38 and 40. Bonding pads of test structures $42_3$ and $42_4$ each shift toward one direction. Accordingly, the connection status of test structures 42 indicates the direction of the misalignment. For example, if the test structures $42_2$ and $42_4$ are disconnected, while the test structures $42_1$ and $42_3$ are connected, it is known die 24 misaligns towards the right.

Figure 6:
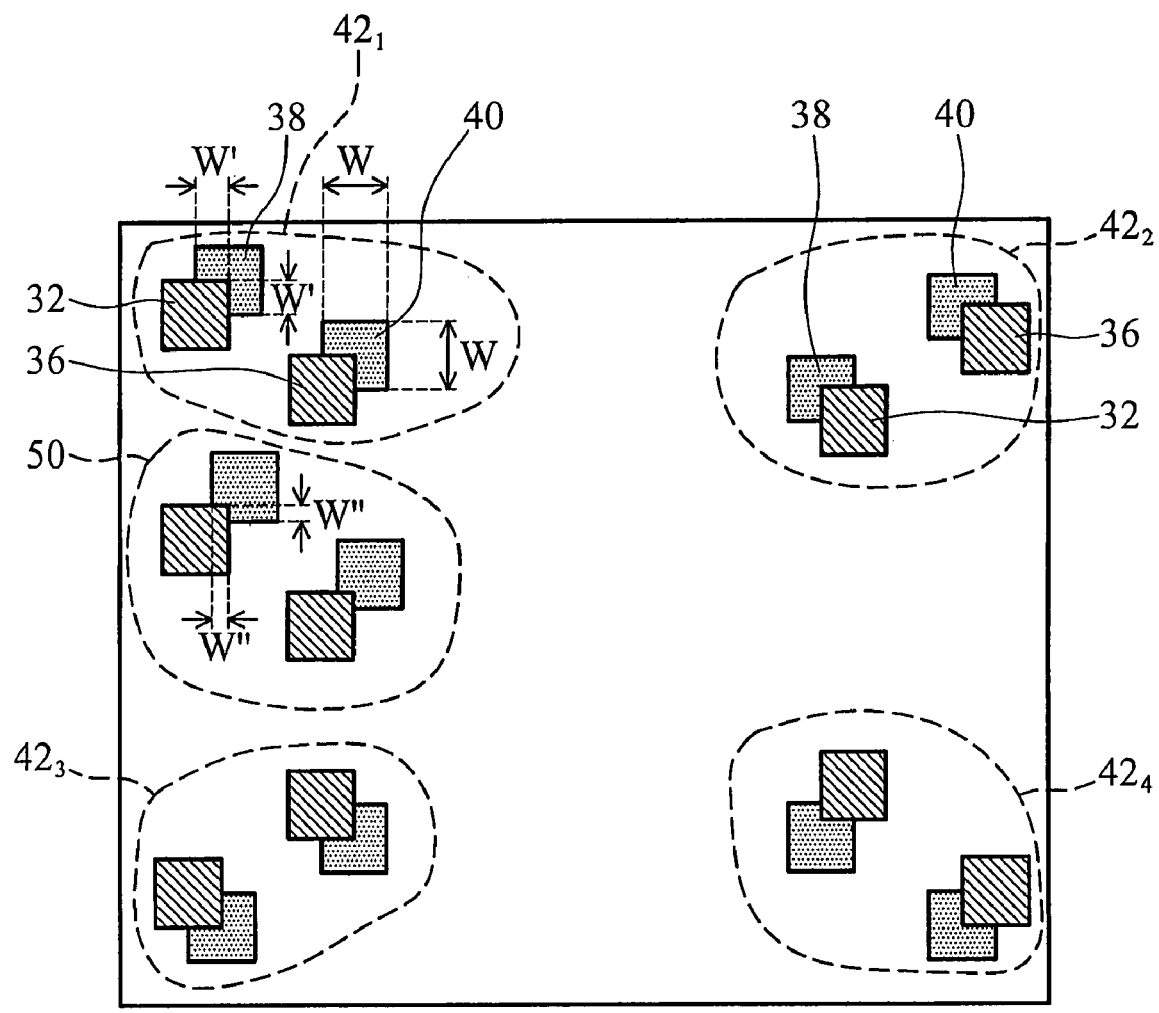

Sometimes, even though the misalignment is less than the maximum allowable misalignment, and thus the stacked dies are good dies, the misalignment still needs to be known in order to improve bonding processes. FIG. 6 illustrates an embodiment similar to the embodiment shown in FIG. 5, except there are additional test structures 50 (only one is shown for simplicity). It is preferable that the overlap dimensions of test structures 50 are different from that of the test structures 42. In an exemplary embodiment, the dimensions W' of overlap regions in test structures 42 are equal to the maximum allowable misalignment, therefore test structures 42 may be used to determine whether the resulting stacked dies are good dies or not. The dimensions W''' of overlap regions in test structures 50 are less than dimensions W', and the connection status of test structures 50 may be used to improve the subsequent bonding processes. For example, if electrical paths in some of test structures 50 are broken while none of the electrical paths in test structures 42 are broken, it is known that there is a misalignment between W''' and W'. Again, four test structures 50 may be formed, each at a corner of the stacked dies, and each is shifted to one direction from others.

Figure 7:
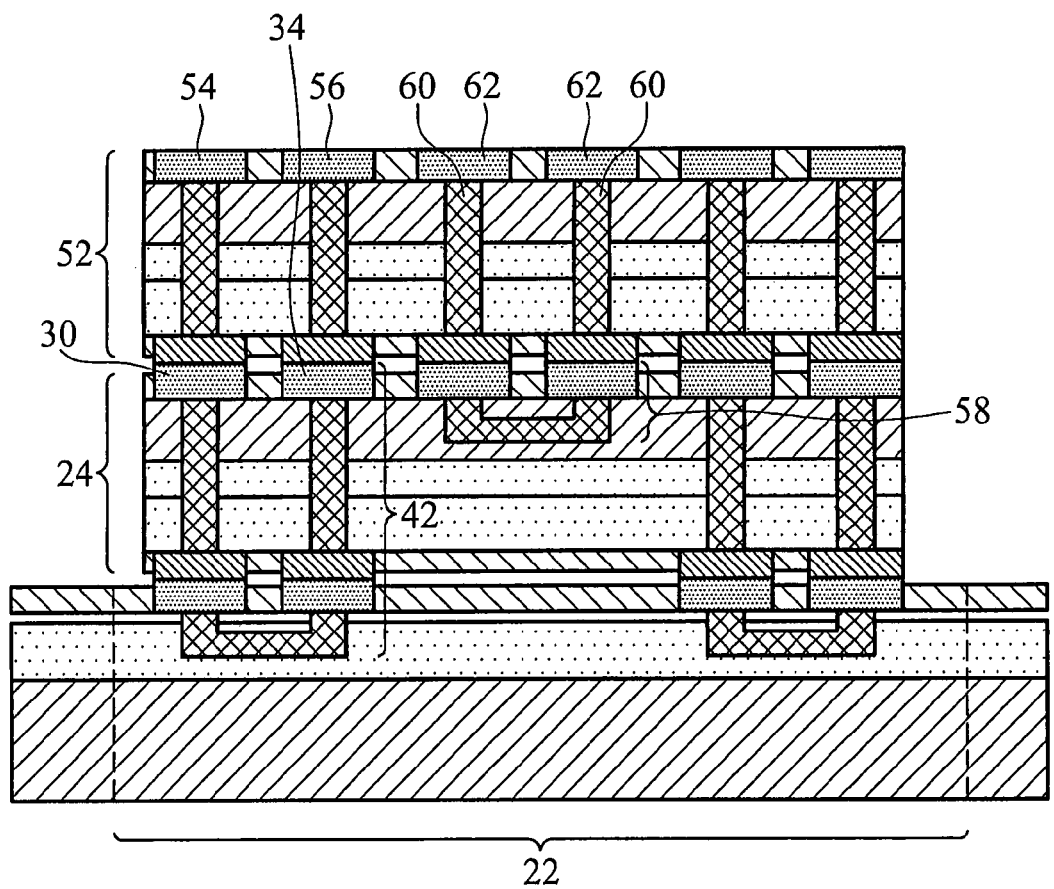
FIGS. 7 and 8 illustrate the stacking of more than two dies.

In FIG. 7, die 52 is stacked on die 24. Preferably, die 52 includes an interconnect structure essentially the same as the interconnect structure in die 24. The interconnect structure in die 52 is preferably substantially aligned to the interconnect structures in die 24, so that the top bonding pads 54 and 56 may be electrically connected to the respective bonding pads 30 and 34, which are further connected to the loop-back structure in die 22. Therefore, the misalignment of die 52 to the underlying die 24 may be detected. FIG. 7 further illustrates an additional loop-back structure 58 in die 24, wherein loop-back structure 58 is connected to TSVs 60 and bonding pads 62. Advantageously, with a loop-back structure in each of the stacked dies (except the top die), the location, the magnitude and the direction of the misalignment may be found even after all dies are stacked. For example, if bonding pads 62 are electrically disconnected, then the misalignment occurs between dies 52 and 24. If, however, bonding pads 62 are electrically shorted while bonding pads 54 and 56 are electrically disconnected, then the misalignment occurs between dies 24 and 22.

Figure 8:
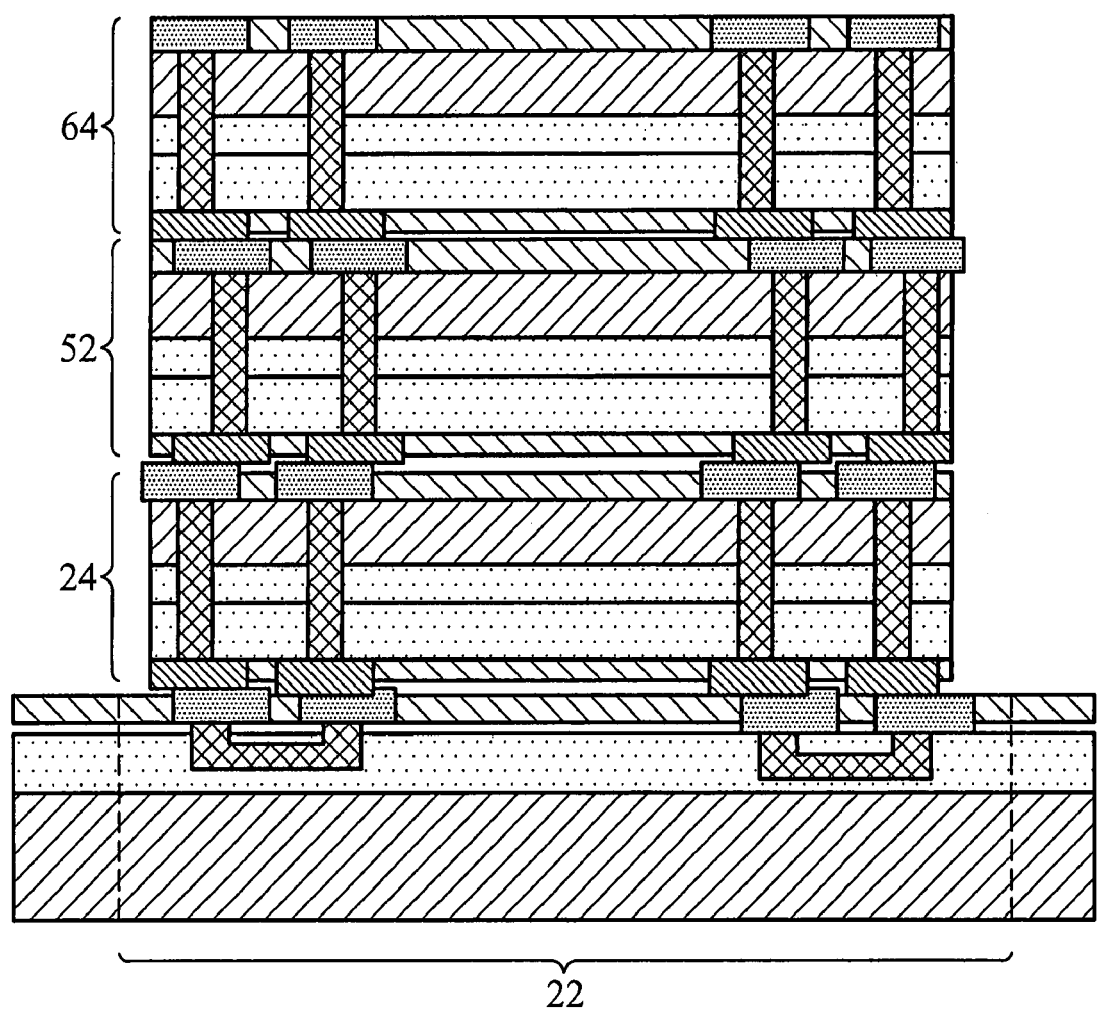

For the embodiment shown in FIG. 5, if multiple dies are to be stacked, the bonding pads in the test structures may have an alternating shift pattern. For example, FIG. 8 shows that bonding pads in dies 22 and 52 are substantially aligned, and bonding pads in dies 24 and 64 are aligned. However, the bonding pads that are bonded together are only partially aligned.

The embodiments of the present invention have several advantageous features. First, the testing of the stacked dies is significantly simplified. Since the bonded dies are known-good-dies, if there is no misalignment, there is no need to merge test programs and to execute a merged test program. Accordingly, the test cost and time-to-market are reduced. Second, the magnitude and direction of the misalignment of the stacked dies can be determined. This allows for further improvements in the accuracy of the bonding processes possible.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor die comprising:
   a first surface;
   a loop-back structure comprising:
      a first bonding pad on the first surface;
      a second bonding pad on the first surface, wherein the first and the second bonding pads are electrically disconnected from integrated circuit devices in the semiconductor die; and
      a conductive feature electrically shorting the first and the second bonding pads.

2. The semiconductor die of claim 1, wherein the conductive feature comprises:

a metal line in a metallization layer;
first vias and first metal lines connecting the metal line and the first bonding pad; and
second vias and second metal lines connecting the metal line and the second bonding pad.

3. The semiconductor die of claim 1 further comprises a plurality of loop-back structures disconnected from each other, each comprising:
a first additional bonding pad on the first surface of the semiconductor die;
a second additional bonding pad on the first surface of the semiconductor die, wherein the first and the second additional bonding pads are disconnected from the integrated circuit devices in the semiconductor die; and
an additional conductive feature electrically shorting the first and the second additional bonding pads.

4. The semiconductor die of claim 1 further comprising
a first and a second through-silicon via;
a third bonding pad and a fourth bonding pad on the first surface of the semiconductor die; and
a fifth and a sixth bonding pad on a second surface of the semiconductor die opposite the first surface, wherein the third and the fifth bonding pads are electrically shorted through the first through-silicon via, and the fourth and the sixth bonding pads are electrically shorted through the second through-silicon via, and wherein the first and the second through-silicon vias are electrically disconnected from the integrated circuit devices in the semiconductor die.

5. A semiconductor package structure comprising:
a first die comprising a loop-back structure, the loop-back structure comprising:
a first bonding pad on a first surface of the first die; and
a second bonding pad on the first surface of the first die; and
a conductive feature electrically shorting the first and the second bonding pads; and
a second die bonded onto the first die, wherein the second die comprises an interconnect structure comprising:
a third bonding pad and a fourth bonding pad on a first surface of the second die, wherein the third and the fourth bonding pads are bonded to the first and the second bonding pads of the first die, respectively;
a first and a second through-silicon via; and
a fifth and a sixth bonding pad on a second surface opposite the first surface of the second die, wherein the third and the fifth bonding pads are electrically shorted through the first through-silicon via, and wherein the fourth and the sixth bonding pads are electrically shorted through the second through-silicon via.

6. The semiconductor package structure of claim 5, wherein the first and the second bonding pads are electrically disconnected from integrated circuit devices in the first die, and wherein the third and the fourth bonding pads are electrically disconnected from integrated circuit devices in the second die.

7. The semiconductor package structure of claim 5, wherein the first and the second bonding pads are substantially aligned to the third and the fourth bonding pads, respectively.

8. The semiconductor package structure of claim 5, wherein the first and the second bonding pads are partially aligned to the third and the fourth bonding pads, respectively.

9. The semiconductor package structure of claim 8 further comprising:

a third die bonded onto the second die, wherein the third die comprises a first plurality of interconnect structures;
a fourth die bonded onto the third die, wherein the fourth die comprises a second plurality of interconnect structures, each being partially aligned to and electrically connected to one of the first plurality of interconnect structures, wherein each of the first plurality of interconnect structures is misaligned to a respective one of the second plurality interconnect structures in a direction different from a remaining of the first plurality of interconnect structures, and wherein the first and the second bonding pads are aligned to bonding pads of one of the first plurality of interconnect structures, and the fifth and the sixth bonding pads are aligned to bonding pads of one of the second plurality of interconnect structures.

10. The semiconductor package structure of claim 5, wherein the second die further comprises a loop-back structure connected to additional bonding pads on the second surface of the second die.

11. The semiconductor package structure of claim 5, wherein the first die is in a wafer, and the second die is a separate die.

12. A semiconductor package structure comprising:
a first die;
a second die bonded onto the first die; and
a plurality of test structures formed throughout the first and the second dies, wherein each of the plurality of test structures comprises:
a loop-back structure in the first die comprising:
a first bonding pad on a first surface of the first die;
a second bonding pad on the first surface of the first die; and
a conductive feature electrically shorting the first and the second bonding pads;
a third bonding pad and a fourth bonding pad on a first surface of the second die, wherein the third and the fourth bonding pads are bonded to the first and the second bonding pads of the first die, respectively;
a first and a second through-silicon via in the second die; and
a fifth and a sixth bonding pad on a second surface opposite the first surface of the second die, wherein the third and the fifth bonding pads are electrically connected through the first through-silicon via, and the fourth and the sixth bonding pads are electrically shorted through the second through-silicon via.

13. The semiconductor package structure of claim 12, wherein in each of the plurality of test structures, the third and the fourth bonding pads are substantially fully aligned to the first and the second bonding pads, respectively.

14. The semiconductor package structure of claim 12, wherein in each of the plurality of test structures, the third and the fourth bonding pads are partially aligned to the first and the second bonding pads, respectively.

15. The semiconductor package structure of claim 12, wherein in each of the plurality of test structures, the first, the second, the third, and the fourth bonding pads have a dimension substantially close to cross-sectional dimensions of the first and the second through-silicon vias.

16. The semiconductor package structure of claim 12, wherein in each of the plurality of test structures, the first, the second, the third, and the fourth bonding pads have a dimension substantially less than cross-sectional dimensions of the first and the second through-silicon vias.

17. The semiconductor package structure of claim 12, wherein the plurality of test structures comprises a first test structure and a second test structure, where the third bonding pad and the first bonding pad of the first test structure are misaligned toward a first direction, and wherein the first bonding pad and the third bonding pad of the second test structure are misaligned toward a second direction different from the first direction.

18. The semiconductor package structure of claim 12, wherein the plurality of test structures comprises a first test structure and a second test structure, where the third bonding pad and the first bonding pad of the first test structure have a first overlap dimension, and wherein the first bonding pad and the third bonding pad of the second test structure have a second overlap dimension substantially different from the first overlap dimension.

19. The semiconductor package structure of claim 12, wherein the plurality of test structures comprises four test structures each formed at a corner of the first and the second dies, and wherein the third bonding pad and the first bonding pad in each of the four test structures are misaligned in a direction different from a remaining of the four test structures.

* * * * *